US010007300B2

(12) United States Patent
Zhang et al.

(10) Patent No.: US 10,007,300 B2
(45) Date of Patent: Jun. 26, 2018

(54) ARRAY SUBSTRATE, DISPLAY PANEL AND METHOD FOR DETECTING BENT DEGREE OF THE SAME (71) Applicants: BOE Technology Group Co., Ltd., Beijing (CN); Beijing BOE Display Technology Co., Ltd., Beijing (CN)

(72) Inventors: Bin Zhang, Beijing (CN); Yu Xie, Beijing (CN); Zhihan Zhou, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 126 days.

(21) Appl. No.: 15/071,249

(22) Filed: Mar. 16, 2016

(65) Prior Publication Data
US 2016/0299530 A1 Oct. 13, 2016

(30) Foreign Application Priority Data

Apr. 7, 2015 (CN) .......................... 2015 1 0162269

(51) Int. Cl.
G09G 5/00 (2006.01)
G06F 1/16 (2006.01)
(Continued)

(52) U.S. Cl.
CPC ............ G06F 1/1652 (2013.01); G06F 3/041 (2013.01); G06F 3/045 (2013.01); G09G 3/006 (2013.01);
(Continued)

(58) Field of Classification Search
CPC ........ G06F 1/1652; G06F 3/041; G06F 3/045; G09G 3/006; G09G 2380/02; G09G 2290/00; H01L 27/124; H01L 27/1218
See application file for complete search history.

(56) References Cited

U.S. PATENT DOCUMENTS 8,072,437 B2   12/2011   Miller et al.
8,194,399 B2    6/2012   Ashcraft et al.
(Continued)

FOREIGN PATENT DOCUMENTS

CN    102087824 A    6/2011
CN    102483657 A    5/2012
(Continued)

OTHER PUBLICATIONS

First Office Action, including Search Report, for Chinese Patent Application No. 201510162269.4, dated Dec. 9, 2016, 10 pages.
(Continued)

Primary Examiner — Nelson Rosario
Assistant Examiner — Andrew Lee
(74) Attorney, Agent, or Firm — Westman, Champlin & Koehler, P.A.

(57) ABSTRACT

Embodiments of the present invention disclose an array substrate including: a flexible supporting base on which a plurality of rows of scanning lines and a plurality of columns of data lines are provided and are crossed to define a plurality of pixel units on the flexible supporting base. The flexible supporting base is further provided thereon with a plurality of rows of first signal lines and a plurality of columns of second signal lines, and conductor layers. Each of the conductor layers is located within one of at least some of the pixel units, is connected to a corresponding column of second signal line, and is configured for generating an electrical signal that is associated with a bent degree of the
(Continued)

array substrate, and for outputting the electrical signal via the corresponding column of second signal line under driving of a signal from the first signal line. Meanwhile, a display panel and a method of detecting a bent degree of the same are disclosed.

10 Claims, 5 Drawing Sheets (51) Int. Cl.
  *H01L 27/12* (2006.01)
  *G06F 3/045* (2006.01)
  *G06F 3/041* (2006.01)
  *G09G 3/00* (2006.01)

(52) U.S. Cl.
  CPC ........ *H01L 27/124* (2013.01); *H01L 27/1218* (2013.01); *G09G 2290/00* (2013.01); *G09G 2380/02* (2013.01)

(56) References Cited

U.S. PATENT DOCUMENTS

| 9,177,501 B2 | 11/2015 | Moriwaki | |
| 9,256,298 B2 | 2/2016 | Zhou | |
| 2013/0187877 A1* | 7/2013 | Tada | G06F 3/0416 345/173 |
| 2014/0043288 A1* | 2/2014 | Kurasawa | G06F 3/0412 345/174 |
| 2015/0091016 A1* | 4/2015 | Chen | G09G 3/3225 257/72 |
| 2016/0026219 A1* | 1/2016 | Kim | H04M 1/0245 345/173 |
| 2016/0254328 A1 | 9/2016 | Song | |

FOREIGN PATENT DOCUMENTS

| CN | 102629446 A | 8/2012 |
| CN | 104318861 A | 1/2015 |

OTHER PUBLICATIONS

Second Office Action for Chinese Patent Application No. 201510162269.4, dated Jun. 5, 2017, 10 pages.
Third Office Action from Chinese Patent Application No. 201510162269.4, dated Oct. 17, 2017, 13 pages.

* cited by examiner

ARRAY SUBSTRATE, DISPLAY PANEL AND METHOD FOR DETECTING BENT DEGREE OF THE SAME

CROSS-REFERENCE TO RELATED APPLICATION

This application claims the benefit of Chinese Patent Application No. 201510162269.4 filed on Apr. 7, 2015 in the State Intellectual Property Office of China, the whole disclosure of which is incorporated herein by reference.

BACKGROUND

Technical Field

Embodiments of the present invention generally relate to the field of liquid crystal display, and particularly, to an array substrate, a display panel and a method for detecting bent degree of a display panel.

Description of the Related Art

Flexible display panel, compared to a conventional display panel, is lighter and thinner in appearance and is lower in power consumption, which helps to enhance endurance ability of an apparatus. Meanwhile, due to its characteristics of bendable and well flexibility, the flexible display panel might reduce a probability that the apparatus damages accidentally, and also has a greater durability than the conventional display panel. However, in use, bending of the flexible display panel may cause problems such as damage to the apparatus, distortion of image, etc. Accordingly, it is necessary to real-time detect a bent degree of the flexible display panel during its use.

In prior arts, there is a solution in which a plurality of sensing elements are arranged to detect a bent degree of the flexible display panel. This solution is achieved by detecting variation of a distance between one sensing element and another sensing element by means of electromagnetic force or other ways. For a flexible display panel having a very small thickness, however, it is difficult to arrange the sensing elements within the display panel. There is also another solution in which the sensing elements are arranged outside the display panel, but, such solution might cause a large error in a measurement of variation of a smaller distance. In addition, the sensing elements which perform the detection by means of electromagnetic force or other ways will easily interfered by external environment. For example, detection result from the sensing elements will be greatly affected when located within a magnetic field.

SUMMARY

According to a first aspect, there is provided an array substrate comprising: a flexible supporting base on which a plurality of rows of scanning lines and a plurality of columns data lines are provided and are crossed to define a plurality of pixel units on the flexible supporting base; wherein, the flexible supporting base is further provided thereon with a plurality of rows of first signal lines and a plurality of columns of second signal lines, and conductor layers, each of which is located within one of at least some of the pixel units, connected with a corresponding column of second signal line, and configured for generating an electrical signal that is associated with a bent degree of the array substrate, and for outputting the electrical signal via the corresponding column of second signal line under driving of a signal from the first signal line.

According to a second aspect, there is provided a display panel comprising the abovementioned array substrate.

According to a second aspect, there is provided a method of detecting a bent degree of a display panel, wherein, the display panel comprises an array substrate comprising: a flexible supporting base on which a plurality of rows of scanning lines and a plurality of columns of data lines are provided and are crossed to define a plurality of pixel units on the flexible supporting base; the flexible supporting base is further provided thereon with a plurality of rows of first signal lines and a plurality of columns of second signal lines, and is also provided thereon with conductor layers, each of which is located within one of at least some of the pixel units and connected to a corresponding column of second signal line. The method comprises:

outputting a scanning signal to respective rows of first signal lines successively;

providing a preset voltage to the conductor layer within one of the at least some of the pixel units when the one pixel unit receives the scanning signal from a corresponding row of first signal line;

acquiring an electrical signal from the corresponding column of second signal line, and obtaining a resistance value of the conductor layer based on the preset voltage and the acquired electrical signal; and calculating a bent degree of the conductor layer in accordance with the resistance value of the conductor layer.

BRIEF DESCRIPTION OF THE DRAWINGS

In order to provide a more clear explanation of embodiments of the present invention or prior art solutions, there is provided a brief introduction of the attached drawings used in the following description of the embodiments and the prior art solutions. Obviously, the drawings mentioned in the following description belong to some embodiments of the present invention. However, for those skilled in the art, other drawings may be achieved on the basis of these attached drawings without involving any inventive steps.

DETAILED DESCRIPTION OF THE EMBODIMENTS

In order to provide a more clear understanding of objects, technique solutions and advantages of embodiments of the present invention, the embodiments of the present invention will be further described hereinafter in detail and completely with reference to the attached drawings. Obviously, the embodiments illustrated in these drawings are only some of embodiments of the present invention, instead of all of the embodiments of the present invention. For those skilled in the art, other embodiments achieved by referring to the following embodiments without involving any inventive steps fall into the scope of the present invention.

In accordance with a general inventive concept of the present invention, there is provided an array substrate including: a flexible supporting base on which a plurality of rows of scanning lines and a plurality of columns of data lines are provided and are crossed to define a plurality of pixel units on the flexible supporting base; wherein, the flexible supporting base is further provided thereon with a plurality of rows of first signal lines and a plurality of columns of second signal lines, and is provided thereon with conductor layers each located within one of at least some of the pixel units, and the conductor layer is connected with a corresponding column of second signal line, and is configured for generating an electrical signal that is associated with a bent degree of the array substrate, and for outputting the electrical signal via the corresponding column of second signal line under driving of a signal from the first signal line. Meanwhile, there is provided a display panel including the abovementioned array substrate. In addition, there is provided a method of detecting a bent degree of a display panel, wherein, the display panel comprises an array substrate comprising: a flexible supporting base on which a plurality of rows of scanning lines and a plurality of columns of data lines are provided and are crossed to define a plurality of pixel units on the flexible supporting base; wherein, the flexible supporting base is further provided thereon with a plurality of rows of first signal lines and a plurality of columns of second signal lines, and is provided thereon with conductor layers each located within one of at least some of the pixel units, the respective conductor layer is connected with a corresponding column of second signal line. The method comprises: outputting a scanning signal to the respective rows of first signal line successively; supplying a preset voltage to the conductor layer within one of the at least some of the pixel units when the one pixel unit receives the scanning signal from the first signal line; acquiring an electrical signal from the corresponding column of second signal line connected with the conductor layer supplied with the preset voltage, and obtaining a resistance value of the conductor layer based on the preset voltage and the acquired electrical signal; and calculating a bent degree of the conductor layer in accordance with the resistance value of the conductor layer.

Figure 1:
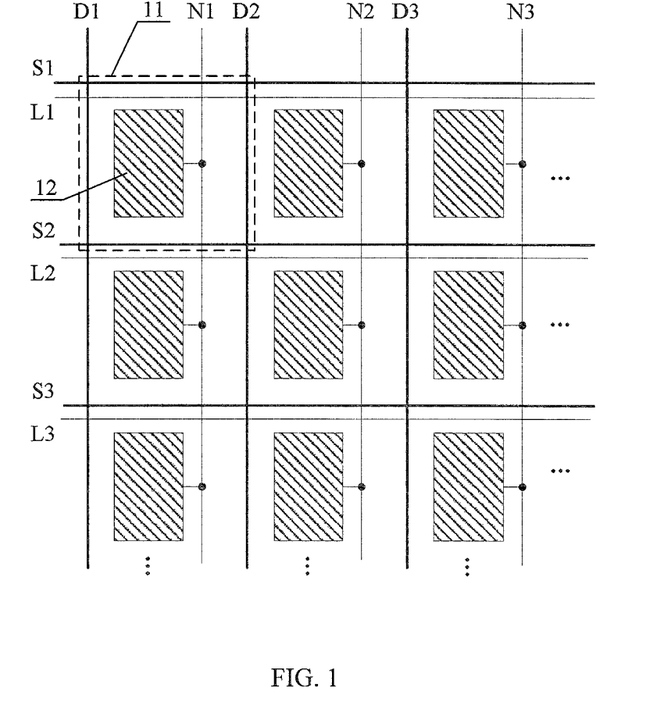
FIG. 1 is a structural schematic diagram, shown in an overlook view, of an array substrate according to an embodiment of the present invention.

FIG. 1 is a structural schematic diagram, shown in an overlook view, of an array substrate according to an embodiment of the present invention. Referring to FIG. 1, the array substrate comprises a flexible supporting base, and a plurality of rows of scanning lines (e.g., first, second and third rows of scanning lines S1, S2, S3, shown in FIG. 1) and a plurality of columns of data lines (e.g., first, second and third columns of data lines D1, D2, D3, shown in FIG. 1) are provided on the flexible supporting base. The plurality of rows of scanning lines and the plurality of columns of data lines are crossed to define a plurality of pixel units on the flexible supporting base, e.g., a pixel unit 11 located in a first row and a first column shown in FIG. 1. The flexible supporting base is further provided thereon with a plurality of rows of first signal lines (e.g., first, second and third rows of first signal lines L1, L2, L3, shown in FIG. 1) and a plurality of columns of second signal lines (e.g., first, second and third columns of second signal lines N1, N2, N3, shown in FIG. 1). In the array substrate, a conductor layer is provided within each of at least some of the abovementioned pixel units (e.g., a conductor layer 12 within the pixel unit 11) and is connected with a corresponding column of second signal line. In particular, the conductor layer provided within the pixel unit is configured for generating an electrical signal that is associated with a bent degree of the array substrate, and for outputting the electrical signal via the corresponding column of second signal line under driving of a signal from the first signal line.

It should be noted that, the at least some of the pixel units provided with the conductor layers can be all or parts of the pixel units in the array substrate, and the number of the pixel units provided with the conductor layers may be set in accordance with requirements of detecting a bent degree. Moreover, the abovementioned conductor layer may be any conductor structure that is capable of generating a variable resistance value based on degree of bending of the supporting base, within the pixel unit. For example, the conductor layer may be a metal thin film or a carbon thin film, and will not be limited herein. In addition, the signal in the abovementioned first signal line is a signal of driving the output of an electrical signal that is associated with a bent degree of the array substrate. Specific driving manner (for example, a driving operation performed by controlling application of the offset voltage, or a driving operation performed by providing a capacitor that is configured to store the abovementioned electrical signal and by reading the electrical signal periodically) will be adopted with reference to those in the prior art by those skilled in the art, and will not be limited herein.

As a result, when the array substrate is bent, partial stress is changed and the conductor layer varies in shape under the action of the partial stress, so that the resistance value of the conductor layer varies correspondingly.

Accordingly, in the embodiments of the present invention, the bent degree of the array substrate may be calculated by providing the conductor layer within the pixel unit of the array substrate and measuring the resistance value of the conductor layer, which helps to alleviate the problems including image distortion and the like during a non-planar displaying, and improve the displaying effect. Moreover, the conductor layer may be provided within all or some of the pixel units of the array substrate, and the bent degree of each conductor layer can be measured. In like manner, the bent degree of the array substrate at any position might be measured, which may achieve a better bent degree detecting effect with a lower cost. Embodiments of the present invention might be applicable in the manufacturing process of the display panel including current OLED (Organic Light-Emitting Diode) and LTPS (Low Temperature Poly-silicon), or the like, and accordingly have a wide scope of application.

Further, on the basis of the abovementioned solution, the above array substrate may include the following structure(s) not shown in figures:

a scanning module connected to the plurality of rows of first signal lines, and configured for outputting a scanning signal to the respective rows of first signal lines successively;

switching modules located respectively within the at least some of the pixel units, each connected to a corresponding row of first signal line and connected to the conductor layer within the pixel unit where the switching module is located, and configured for providing a preset voltage to the conductor layer upon receiving the scanning signal from the corresponding row of first signal line;

an acquisition module connected to the plurality of columns of second signal lines, and configured for acquiring the electrical signal from the plurality of columns of second signal lines and for obtaining a resistance value of the conductor layer based on the preset voltage and the acquired electrical signal; and a calculation module connected to the acquisition module, and configured for calculating a bent degree of the conductor layer in accordance with the resistance value obtained from acquisition module.

For example, the scanning module may output pulsing signals to the first signal lines row by row so as to switch on successively the switching modules connected to the first signal lines. Preset voltage is provided to the conductor layer when its corresponding switching module is switched on, such that the conductor layer could generate an electrical signal that is associated with a bent degree of the array substrate (caused by variation of the resistance of the conductor layer). The acquisition module may acquire and process all of the electrical signals generated in the conductor layers within one row of pixel units, so as to obtain resistance values of the conductor layers within the one row of pixel units. The resistance values are outputted from the scanning module row by row, and accordingly resistance values of the conductor layers within all of the pixel units may be obtained. At last, the calculation module may calculate bent degrees of the conductor layers at different positions in accordance with the resistance values, e.g., perform the calculation in accordance with a preset curve, thereby a bent degree of the whole array substrate can be obtained.

Thus it can be seen, the above scanning module may be provided in a gate driver or time controller (TCON) for the array substrate, the above switching modules may be achieved by a design of circuit in the pixels, and, the above acquisition module and calculation module may be provided in a data driver or the time controller (TCON) for the array substrate. As a result, embodiments of the present invention enable a real-time detection of the bent degree by means of addition of a simple configuration into the prior art array substrate, which addition is simple and practicable, is lower in the cost, and has a wide scope of application.

Figure 2:
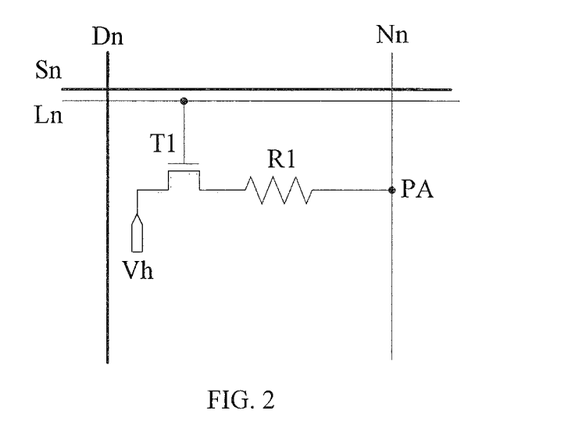
FIG. 2 is a partial circuit diagram of a pixel unit of an array substrate according to an embodiment of the present invention.

Principle on detection of the bent degree of the abovementioned array substrate will be explained in detail by taking an arbitrary pixel unit (to which a scanning line Sn, a data line Dn, a first signal line Ln and a second signal line Nn are provided) as an example. FIG. 2 is a partial circuit diagram of a pixel unit of an array substrate according to an embodiment of the present invention. Referring to FIG. 2, an equivalent resistor R1 represents the abovementioned conductor layer within the pixel unit and indicates the resistance value of the conductor layer between two connection points. A second end of the equivalent resistor R1 is connected to the second signal line Nn. Meanwhile, the switching module is embodied as a thin-film transistor T1 here. As shown in FIG. 2, a gate of the thin-film transistor T1 is connected to the first signal line Ln, and one of a source and a drain of the thin-film transistor T1 is connected to a first end of the equivalent resistor R1 while the other is connected to a preset voltage Vh. Since a thin-film transistor includes an N-type thin-film transistor and a P-type thin-film transistor, connections of the source and the drain of the thin-film transistor T1 depend on these conditions during the practical applications. In other embodiments of the present invention, the switching modules may be achieved in other implementation manners, for example, may include a logic operation circuit or an electric relay, etc., and, there is no limitation on this herein.

On the basis of the structure of the circuit, once a pulsing signal enters the first signal line Ln, the thin-film transistor T1 switches on, so that the preset voltage Vh is applied onto the first end of the equivalent resistor R1, thereby an electrical signal at a node PA may carry information regarding resistance value of the equivalent resistor R1. That is to say, by the structure of the circuit, outputting of the electrical signal that is associated with the bent degree of the conductor layer may be achieved under driving of a signal form the first signal line.

Figure 3:
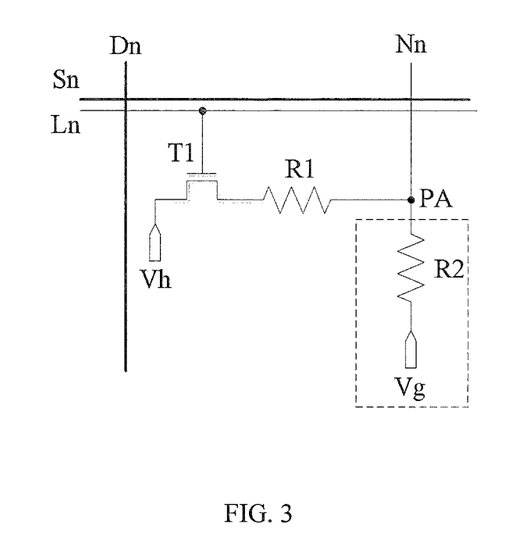
FIG. 3 is a partial circuit diagram of a pixel unit included in an array substrate according to another embodiment of the present invention.

On the basis of the above technical solution, in order to facilitate measurement of the resistance value of the equivalent resistor R1, the acquisition module can include a first reference resistor R2 for each column of second signal line. FIG. 3 is a partial circuit diagram of a pixel unit of an array substrate according to another embodiment of the present invention. Referring to FIG. 3, a first end of the first reference resistor R2 is connected, at a point PA, to the equivalent resistor R1, and a second end thereof is connected to a reference voltage Vg. On one hand, addition of the first reference resistor R2 leads to sharing of the voltage between first reference resistor R2 and the equivalent resistor R1. Since the resistance value of the first reference resistor R2, the preset voltage Vh and the reference voltage Vg are known the resistance value of the equivalent resistor R1 might be obtained once a voltage at the point PA is acquired. On the other hand, once there is an over-voltage at the point PA in FIG. 3, or a large current passes therethrough, the additional first reference resistor might protect the circuit, especially the thin-film transistor T1. The first reference resistor R2 may be provided inside or outside the pixel unit. Optionally, the first reference resistor R2 is provided outside the pixel unit (e.g., a section in a dashed box is provided in a region outside a display region of the array substrate, as shown in FIG. 3), and, the pixel units in one column share the first reference resistor R2, which makes the circuit simple and convenient.

Figure 4:
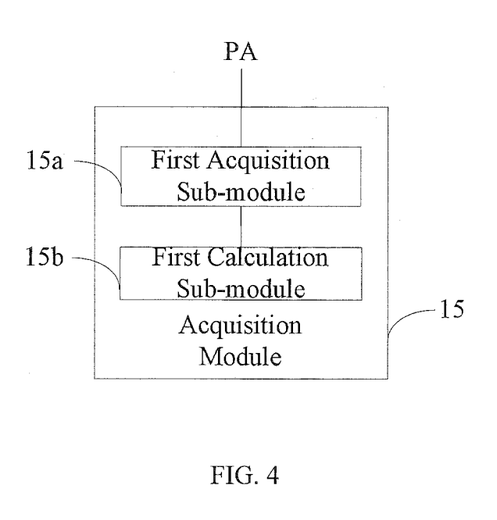
FIG. 4 is a functional block diagram of an acquisition module according to an embodiment of the present invention.

For the above structure, FIG. 4 is a functional block diagram of an acquisition module according to an embodiment of the present invention. Referring to FIG. 4, for each first reference resistor R2, the acquisition module 15 comprises a first acquisition sub-module 15a and a first calculation sub-module 15b. The first acquisition sub-module 15a is connected to the second signal line Nn and acquires an electrical signal from the second signal lines Nn at the point PA in a connection line between the first acquisition sub-module 15a and the second signal line Nn. The first calculation sub-module 15b is connected to the first acquisition sub-module 15a, for calculating a resistance value of the equivalent resistor R1 in accordance with the electrical signal obtained from first acquisition sub-module 15a in combination with the voltage value of the preset voltage, the resistance value of the first reference resistor R2 and the voltage value Vg of the reference voltage. Provided that the preset voltage is Vh, the resistance value of the first reference resistor is r2, the reference voltage is Vg and the voltage measured at a point PA by the acquisition module is Va, then, a resistance value r1 of the equivalent resistor R1 can be achieved by the following equation:

$$r_1 = \frac{Vh - Va}{Va - Vg} \times r_2.$$

Accordingly, the resistance value of the equivalent resistor R1 can be obtained easily by means of the provision of the first reference resistor R2.

However, since a certain systematic error might occur in the measurement of the resistance of the conductor layer with the abovementioned structure of the circuit, another structure may be adopted for the acquisition module 15 in this embodiment, in order for improving accuracy of the measurement. That is, the acquisition module 15 may further comprise a second reference resistor R3 and a third reference resistor R4, for each first reference resistor R2.

Figure 5:
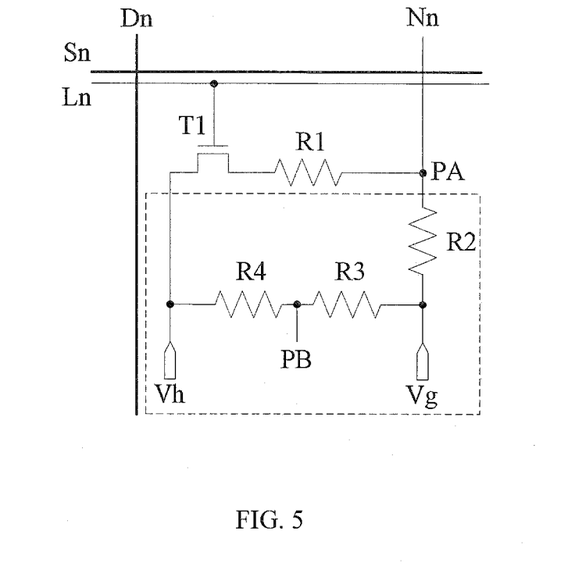
FIG. 5 is a partial circuit diagram of a pixel unit included in an array substrate according to yet another embodiment of the present invention.
Figure 6:
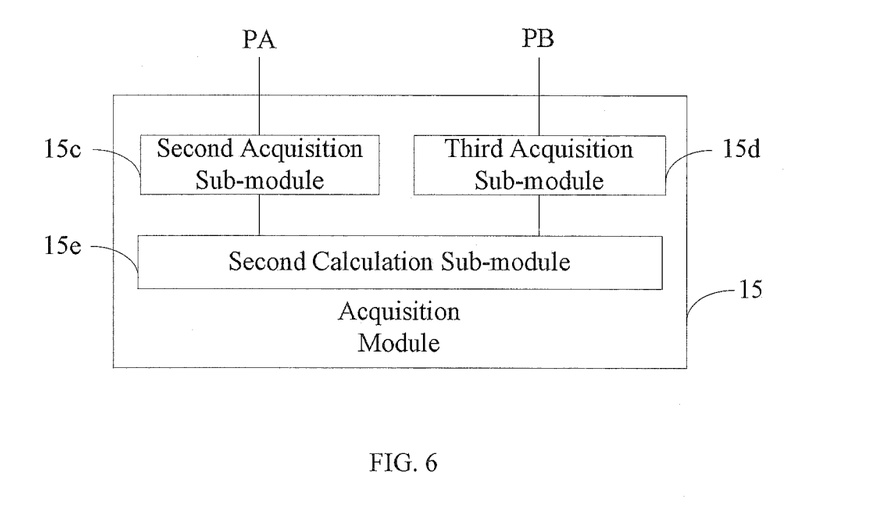
FIG. 6 is a functional block diagram of an acquisition module according to another embodiment of the present invention.

FIG. 5 is a partial circuit diagram of a pixel unit included in an array substrate according to yet another embodiment of the present invention. Referring to FIG. 5, a first end of the second reference resistor R3 is connected at a point PB to a second end of the third reference resistor R4, a second end of the second reference resistor R3 is connected to a second end of the first reference resistor R2, and, a first end of the third reference resistor is connected to a preset voltage Vh. The equivalent resistor R1, the first reference resistor R2, the second reference resistor R3 and the third reference resistor R4 constitute a bridge circuit. In order to measure voltage values of two branches of the bridge circuit and a difference therebetween, the acquisition module 15 needs to adopt a corresponding structure. FIG. 6 is a functional block diagram of an acquisition module according to another embodiment of the present invention. Referring to FIG. 6, for each first reference resistor R2, the acquisition module 15 further comprises a second acquisition sub-module 15c, a third acquisition sub-module 15d and a second calculation sub-module 15e.

The second acquisition sub-module 15c is connected to the first end of the first reference resistor R2, namely at the point PA, for acquiring an electrical signal from the second signal line.

The third acquisition sub-module 15d is connected to a first end of the second reference resistor R3, namely at the point PB, for acquiring an electrical signal at the first end of the second reference resistor R3.

The second calculation sub-module 15e is connected to the second acquisition sub-module 15c and the third acquisition sub-module 15d, for calculating a resistance value of the equivalent resistor R1 by performing a comparison between the electrical signal obtained by the second acquisition sub-module 15c and the electrical signal obtained by the third acquisition sub-module 15d, and using a result of the comparison in combination with the first reference resistor R2, the second reference resistor R3 and the third reference resistor R4.

Of course, the first reference resistor R2, the second reference resistor R3 and the third reference resistor R4 may be provided outside of the pixel unit, and, the pixel units in one row may share the first reference resistor R2, the second reference resistor R3 and the third reference resistor R4 (e.g., a section in a dashed box is provided in a region outside a display region of the array substrate, as shown in FIG. 5), which makes the entire circuit simple and convenient.

Provided that the preset voltage is Vh, a resistance value of the conductor layer is r1, a resistance value of the first reference resistor is r2, the reference voltage is Vg, a voltage measured at a point PA by the acquisition module is Va, a resistance value of the second reference resistor R3 is r3, a resistance value of the third reference resistor R4 is r4, a voltage measured at a point PB is Vb, then, a voltage difference Va-Vb between the point PA and the point PB can be obtained as follows:

$$Va - Vb = \frac{r_2 r_4 - r_1 r_3}{(r_1 + r_2)(r_3 + r_4)} \times (Vh - Vg).$$

From the above equation, the resistance value of the conductor layer can be derived from the measured value of Va-Vb. Thus it can be seen, in this embodiment, the resistance value of the equivalent resistor R1 can be obtained by means of adoption of the bridge circuit, to eliminate the systematic error in a proportion manner, so as to improve the accuracy of the measurement.

In addition, the resistance value of the equivalent resistor R1 varies depending on the bent degree of the array substrate, then, Va-Vb varies correspondingly at the same time. A Table showing a relationship between the bent degree and the voltage difference Va-Vb between the point PA and the point PB may be obtained through a pre-calibration for a specific array substrate, so that the bent degree of the array substrate may be calculated with reference to the table.

In addition, in order to simplify structure of any of the above array substrate, each row of first signal line and a corresponding row of scanning line adjacent thereto may share one same conductive wire. Here, the scanning module may be provided at the scanning driver of the array substrate, so as to achieve both scanning driving function for the pixel unit and the driving function of the switching module. That is to say, the embodiments of the present invention may be achieved by means of addition of the conductor layer in the pixel unit of the conventional array substrate as well as addition of the corresponding functional module in the conventional circuit. In this way, the whole array substrate is very simple in structure and is easy to be implemented.

In accordance with the same inventive concept, there is provided a display panel including the abovementioned array substrate in accordance with the embodiments of the present invention. The display panel may include a liquid crystal display panel for use in a mobile phone, a tablet computer, a TV set, a notebook PC, a digital frame, a navigator and other products or parts having a displaying function. Due to inclusion of the abovementioned array substrate, the display panel might solve the same technical problem and achieve the same technical effect, and thus will be not described in detail herein.

In accordance with the same inventive concept, there is provided a method of detecting a bent degree of a display panel comprising an array substrate. The array substrate comprises: a flexible supporting base on which a plurality of rows of scanning lines and a plurality of columns of data lines are provided, and are crossed to define a plurality of pixel units on the flexible supporting base; the flexible supporting base is further provided thereon with a plurality of rows of first signal lines and a plurality of columns of second signal lines, and, is provided thereon with conductor layers each located within one of at least some of the pixel units, the conductor layer is connected with a corresponding column of second signal line.

Figure 7:
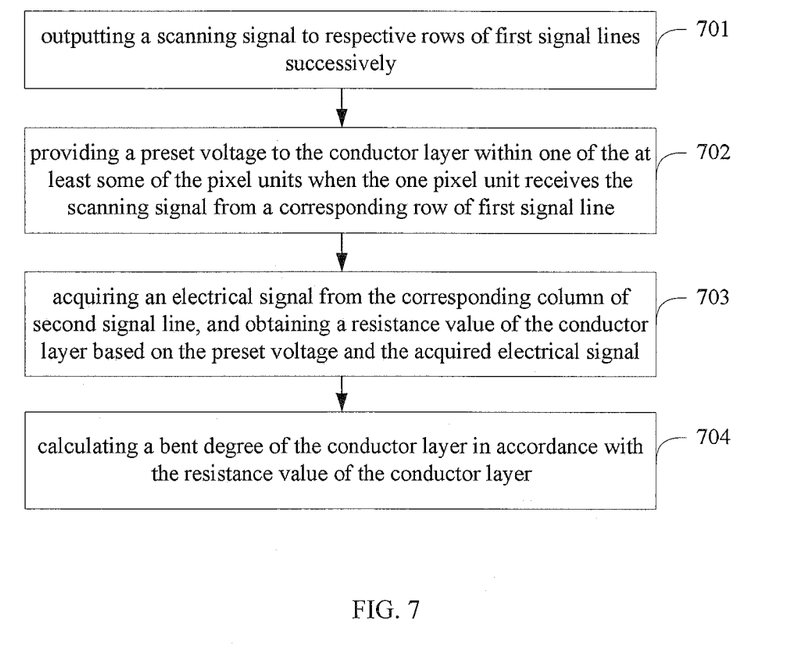
FIG. 7 is a flow chart showing steps of a method of detecting a bent degree of a display panel according to an embodiment of the present invention.

FIG. 7 is a flow chart showing steps of a method of detecting a bent degree of a display panel according to an embodiment of the present invention. Referring to FIG. 7, the method comprises:

a step 701 of outputting a scanning signal to respective rows of first signal lines successively;

a step 702 of providing a preset voltage to the conductor layer within one of the at least some of the pixel units when the one pixel unit receives the scanning signal from a corresponding row of first signal line;

a step 703 of acquiring an electrical signal from the corresponding column of second signal line, and obtaining a resistance value of the conductor layer based on the preset voltage and the acquired electrical signal; and a step 704 of calculating a bent degree of the conductor layer in accordance with the resistance value of the conductor layer.

Accordingly, in the embodiments of the present invention, the bent degree of the array substrate may be calculated by providing the conductor layer within the pixel unit of the array substrate and measuring the resistance value of the conductor layer, which helps to alleviate the problems including image distortion and the like during a non-planar displaying, and improve the displaying effect. Moreover, the conductor layers may be provided within all or some of the pixel units of the array substrate, and, the bent degree of each of the conductor layers may be measured. In like manner, the bent degree of the array substrate at any position may be measured, which may achieve a better bent degree detecting effect with a lower cost. Embodiments of the present invention might be applicable in the manufacturing process of the display panel including current OLED (Organic Light-Emitting Diode) and LTPS (Low Temperature Poly-silicon) and the like, and accordingly have a wide scope of application.

Moreover, in case that one row of first signal line and a corresponding row of corresponding scanning line adjacent thereto share one same conductive wire, the above step 701 may further comprise the following step which is not shown in FIG. 7:

a step 701a of receiving a scanning signal from a scanning driver of the array substrate, and, outputting the scanning signal to respective rows of first signal lines successively.

Figure 8:
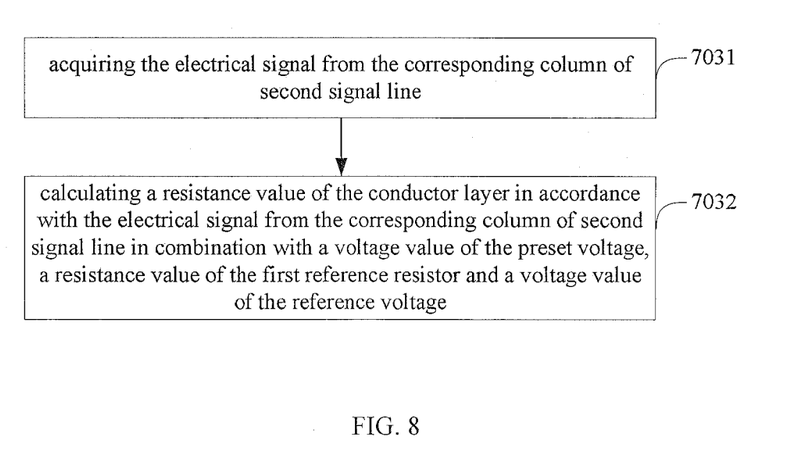
FIG. 8 is a flow chart showing steps of a method of calculating a resistance value of a conductor layer according to an embodiment of the present invention.

In case that the array substrate further comprises a first reference resistor for each column of second signal line, the first reference resistor having a first end connected to respective corresponding column of second signal line and a second end connected to a reference voltage, the step 703 may further comprise the following steps which are shown in FIG. 8:

a step 7031 of acquiring the electrical signal from the second signal line; and a step 7032 of calculating a resistance value of the conductor layer in accordance with the electrical signal from the corresponding column of second signal line in combination with a voltage value of the preset voltage, a resistance value of the first reference resistor and a voltage value of the reference voltage.

Figure 9:
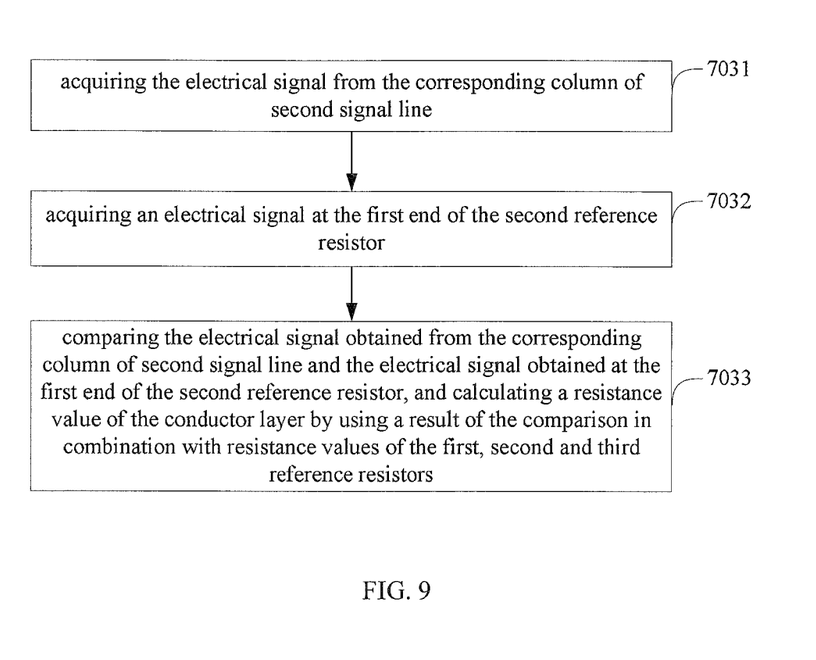
FIG. 9 is a flow chart showing steps of a method of calculating a resistance value of another conductor layer according to another embodiment of the present invention.

In another case that the array substrate further comprises a second reference resistor and a third reference resistor for each column of second signal line, and, the second reference resistor has a first end connected to a second end of the third reference resistor and a second end connected to the second end of the first reference resistor, while a first end of the third reference resistor is connected to the preset voltage, the step 703 may further comprise the following steps which are shown in FIG. 9:

a step 7031 of acquiring the electrical signal from the corresponding column of second signal line;

a step 7032 of acquiring an electrical signal at the first end of the second reference resistor; and a step 7033 of comparing the electrical signal obtained from the corresponding column of second signal line and the electrical signal obtained at the first end of the second reference resistor, and calculating a resistance value of the conductor layer by using a result of the comparison in combination with resistance values of the first, second and third reference resistors.

The electrical signals obtained both in the step 7031 and in the step 7021 are used in the step 7033, and the electrical signal obtained in the step 7031 are not used in the step 7032 and has no direct relationship with those obtained in the step 7032, accordingly, the sequences of the steps 7031 and 7032 are exchangeable.

As can be seen from the above, the abovementioned steps of the method of detecting a display panel have a corresponding correlation with the embodiments of the array substrate as mentioned above, accordingly, the embodiments of the method of detecting a display panel may be achieved with reference to the above embodiments of the array substrate and will be not described repeatedly herein.

Accordingly, from the above solutions, a bent degree of the array substrate may be calculated by providing the conductor layer within the pixel unit of the array substrate and measuring the resistance value of the conductor layer, which helps to alleviate the problems including image distortion and the like during a non-planar displaying, and improve the displaying effect. Moreover, the conductor layers may be provided within all or some of the pixel units of the array substrate, and, the bent degree of each of the conductor layers may be measured. In like manner, the bent degree of the array substrate at any position may be measured, which may achieve a better bent degree detecting effect with a lower cost. Embodiments of the present invention may applicable in the manufacturing process of the display panel including current OLED (Organic Light-Emitting Diode) and LTPS (Low Temperature Poly-silicon) and the like, and accordingly have a wide scope of application.

It should be noted that in the description of embodiments of the present invention, orientations or positional relationships denoted by terminologies "upper", "lower" and the likes are those shown in the figures, and only intended for easing or simplifying the description of embodiments of the present invention, instead of expressing or implying that the devices or elements should be located at specific orientations or should be configured or manipulated at specific orientations, accordingly, they are not intended to limit the scope of the present invention. Unless otherwise specified and defined definitely, terminologies "mount", "connect to", "connect with" and the likes should be explained and illustrated in a broad sense, for example, it can be a fixed connection, or a detachable connection, or an integrated connection; or, it also can be a mechanical connection or an electrical connection; or else, it can be a direction connection or an indirect connection with an intermediate agency; or else, it can be an internal connection between two components. For those skilled in the art, the above terminologies can be explained and illustrated in specific situations in the present disclosure.

It should be noted that, in this description, relationship terminologies, such as "first", "second" and the likes are adopted only for distinguishing one entity or operation from another entity or operation, instead of expressing or implying that there is any actual relationship or sequence between these entities or operations. Moreover, terminologies "comprise", "include" and any other variations are adopted to indicate a non-exclusive inclusion, that is, a process, a method, an article or an apparatus which contains these elements as well as other elements not listed definitely or as well as the elements inherently contained by the process, the method, the article or the apparatus. Unless otherwise specified limitations, the elements defined by phrase "comprise a/one" does not exclusive any additionally identical elements existing in the process, the method, the article or the apparatus containing this element.

The above description is merely used to illustrate embodiments of the present invention, but not to limit the present invention. Although a detailed description of embodiments of the present invention with reference to the attached drawings is provided, it should be understood by those skilled in the art that, all of changes, equivalent alternatives, modifications, made within principles and spirit of the present invention, should be included within the scope of the present invention.

What is claimed is:

1. An array substrate, comprising a flexible supporting base on which a plurality of rows of scanning lines and a plurality of columns data lines are provided and are crossed to define a plurality of pixel units on the flexible supporting base; wherein, the flexible supporting base is further provided thereon with a plurality of rows of first signal lines and a plurality of columns of second signal lines, and conductor layers, each of which is located within one of at least some of the pixel units, connected with a corresponding column of second signal line, and configured for generating an electrical signal that is associated with a bent degree of the array substrate, and for outputting the electrical signal via the corresponding column of second signal line under driving of a signal from the first signal line, wherein:

the array substrate further comprises: an acquisition module connected to the plurality of columns of second signal lines, and configured for acquiring the electrical signal from the plurality of columns of second signal lines, and for obtaining a resistance value of the conductor layer based on a preset voltage and the acquired electrical signal; the acquisition module further comprises: a first reference resistor having a first end connected to the column of second signal line and a second end connected to a reference voltage; and for each column of second signal line, the acquisition module further comprises: a first acquisition sub-module connected to the column of second signal line, for acquiring the electrical signal from the column of second signal line; and a first calculation sub-module connected to the first acquisition sub-module, for calculating a resistance value of the conductor layer in accordance with the electrical signal obtained from first acquisition sub-module in combination with a voltage value of the preset voltage, a resistance value of the first reference resistor and a voltage value of the reference voltage; and a resistance value r1 of the conductor layer R1 is achieved by the following equation:

$$r_1 = \frac{Vh - Va}{Va - Vg} \times r_2;$$

in which, the preset voltage is Vh, the resistance value of the first reference resistor R2 is r2, the reference voltage is Vg and the voltage measured at a point PA by the acquisition module is Va.

2. The array substrate of claim 1, further comprising:
a scanning module connected to the plurality of rows of first signal lines, for outputting a scanning signal to respective rows of first signal lines successively;
switching modules respectively located within the at least some of the pixel units, the switching modules each being connected to a corresponding row of first signal line, being connected to the conductor layer within the pixel unit where the switching module is located, and being configured for providing a preset voltage to the conductor layer upon receiving the scanning signal from the corresponding row of first signal line; and
a calculation module connected to the acquisition module, and configured for calculating a bent degree of the conductor layer in accordance with the resistance value obtained from acquisition module.

3. The array substrate of claim 2, wherein:
one of the rows of first signal line and a corresponding row of scanning line adjacent thereto share one same conductive wire; and
the scanning module is located within a scanning driver of the array substrate.

4. The array substrate of claim 1, wherein, in addition to the first reference resistor, the acquisition module further comprises a second reference resistor and a third reference resistor, for each column of second signal line; and
wherein, the second reference resistor has a first end connected to a second end of the third reference resistor and a second end connected to the second end of the first reference resistor, while a first end of the third reference resistor is connected to the preset voltage.

5. The array substrate of claim 4, wherein, for each first reference resistor, the acquisition module further comprises:
a second acquisition sub-module connected to the corresponding column of second signal line, for acquiring the electrical signal from the corresponding column of second signal line;
a third acquisition sub-module connected to a first end of the second reference resistor, for acquiring a second electrical signal at the first end of the second reference resistor; and
a second calculation sub-module connected to the second acquisition sub-module and the third acquisition sub-module, for comparing the electrical signal obtained from the second acquisition sub-module and the second electrical signal obtained from the third acquisition sub-module, and for calculating a resistance value of the conductor layer by using a result of the comparison in combination with resistance values of the first, second and third reference resistors.

6. A display panel comprising an array substrate of claim 1.

7. A display panel comprising an array substrate of claim 6.

8. A method of detecting a bent degree of a display panel, wherein, the display panel comprises an array substrate comprising: a flexible supporting base on which a plurality of rows of scanning lines and a plurality of columns of data lines are provided and are crossed to define a plurality of pixel units on the flexible supporting base; the flexible supporting base is further provided thereon with a plurality of rows of first signal lines and a plurality of columns of second signal lines, and is also provided thereon with conductor layers, each of which is located within one of at least some of the pixel units and connected to a corresponding column of second signal line; the method comprising:

outputting a scanning signal to respective rows of first signal lines successively;

providing a preset voltage to the conductor layer within one of the at least some of the pixel units when the one pixel unit receives the scanning signal from a corresponding row of first signal line;

acquiring an electrical signal from the corresponding column of second signal line, and obtaining a resistance value of the conductor layer based on the preset voltage and the acquired electrical signal; and calculating a bent degree of the conductor layer in accordance with the resistance value of the conductor layer, wherein:

the step of acquiring the electrical signal and obtaining the resistance value further comprises:

acquiring the electrical signal from the corresponding column of second signal line; and calculating a resistance value of the conductor layer in accordance with the electrical signal from the corresponding column of second signal line in combination with a voltage value of the preset voltage, a resistance value of the first reference resistor and a voltage value of the reference voltage; and a resistance value r1 of the conductor layer R1 is achieved by the following equation:

$$r_1 = \frac{Vh - Va}{Va - Vg} \times r_2;$$

in which, the preset voltage is Vh, the resistance value of the first reference resistor R2 is r2, the reference voltage is Vg and the voltage measured at a point PA by the acquisition module is Va.

9. The method of claim 8, wherein, one of the rows of first signal line and a corresponding row of scanning line adjacent thereto share one same conductive wire; and the step of outputting the scanning signal comprises:
receiving a scanning signal from a scanning driver of the array substrate, and, outputting the scanning signal to respective rows of first signal lines successively.

10. The method of claim 8, wherein, for each column of second signal line, the array substrate further comprises a second reference resistor and a third reference resistor, wherein, the second reference resistor has a first end connected to a second end of the third reference resistor and a second end connected to the second end of the first reference resistor, while a first end of the third reference resistor is connected to the preset voltage; and the step of acquiring the electrical signal and obtaining the resistance value further comprises:

acquiring a second electrical signal from the corresponding column of second signal line;

acquiring an electrical signal at the first end of the second reference resistor; and comparing the electrical signal obtained from the corresponding column of second signal line and the second electrical signal obtained at the first end of the second reference resistor, and calculating a resistance value of the conductor layer by using a result of the comparison in combination with resistance values of the first, second and third reference resistors.

* * * * *